US007881914B2

United States Patent
Trotta et al.

(10) Patent No.: US 7,881,914 B2
(45) Date of Patent: Feb. 1, 2011

(54) SYSTEM AND METHOD FOR COLLECTING AND TRANSPORTING SIMULATION DATA

(75) Inventors: Brian W. Trotta, Lenexa, KS (US); Christopher Charles Wills, Gladstone, MO (US)

(73) Assignee: HNTB Holdings Ltd., Kansas City, MO (US)

( * ) Notice: Subject to any disclaimer, the term of this patent is extended or adjusted under 35 U.S.C. 154(b) by 282 days.

(21) Appl. No.: 11/469,668

(22) Filed: Sep. 1, 2006

(65) Prior Publication Data

US 2007/0052701 A1 Mar. 8, 2007

Related U.S. Application Data

(60) Provisional application No. 60/713,693, filed on Sep. 2, 2005.

(51) Int. Cl.
  *G06G 7/48* (2006.01)
(52) U.S. Cl. .................................. 703/6; 703/8
(58) Field of Classification Search .............. 703/6, 703/8; 345/419, 420, 473
  See application file for complete search history.

(56) References Cited

U.S. PATENT DOCUMENTS

| 4,463,380 | A | 7/1984 | Hooks |
| 7,002,573 | B2 * | 2/2006 | Trotta et al. ............... 345/420 |
| 7,155,376 | B2 * | 12/2006 | Yang et al. ................. 703/8 |
| 7,412,532 | B2 * | 8/2008 | Gondhalekar et al. ..... 709/231 |
| 7,487,074 | B2 * | 2/2009 | Ohtsu et al. ............... 703/8 |

OTHER PUBLICATIONS

Jaynes et al., "Discrete event simulation for quick service restaurant traffic analysis", Proceedings of the 1994 Winter Simulation Conference, Dec. 1994, pp. 1061-1066.*
Kim et al., "Managing scheme for 3-dimensional geo-features using XML", Proceedings of the International Geoscience and Remote Sensing Symposium, 2000, vol. 7, Jul. 2000, pp. 2899-2901.*
Halle et al., "Car Platoons Simulated As A Multiagent System", Proceedings of Agent Based Simulation, vol. 4 (ABS4), 2003, pp. 57-63.*
Ono et al., "A photo-realistic driving simulation system for mixed-reality traffic experiment space", Proceedings of the Intelligent Vehicles Symposium, 2005, Jun. 2005, pp. 747-752.*
Hallé, "Automated Highway System: Platoons of Vehicles Viewed as a Multiagent System", Master's thesis, Université Laval, Québec, Canada, Jan. 2005, 194 pages.*

(Continued)

*Primary Examiner*—Kamini S Shah
*Assistant Examiner*—Herng-Der Day
(74) *Attorney, Agent, or Firm*—Shook, Hardy & Bacon, L.L.P.

(57) ABSTRACT

A system and method for receiving and displaying simulated movement data on a graphical display in real-time is provided. Simulated movement data from a simulation is received. The type and location of each object to be displayed on a graphical display for a time step is extracted from the simulated movement data. The extracted data is transferred to an application for determining an appropriate three-dimensional representation to associate with each type of object in the first point in time. Each three-dimensional representation is displayed according the location of each object for the first point in time of the simulation.

6 Claims, 17 Drawing Sheets

OTHER PUBLICATIONS

Ambroz et al., "3D Road Traffic Situation Simulation System", Advances in Engineering Software, Feb. 2005, pp. 77-86.*

"VISSIM 4.10 User Manual", PTV Planung Transport Verkehr AG, Mar. 2005, pp. 1-310.*

PCT Search Report and Written Opinion, Application No. PCT/US06/34347, dated Mar. 26, 2008.

Michael R. Nevins et al "Simulation, Animation and Visualization of Seaport Operations" Simulation, vol. 71, No. 2, Aug. 1998, pp. 96-106.

Hadipriono FC et al "Implementation of a Virtual Environment for Traffic Accident Simulation—Part I: The 3D Models and Control Panels" Journal of Intelligent and Fuzzy Systems, IOS Press, Amsterdam, NL, vol. 14, No. 4, Jan. 1, 2003, pp. 191-202.

Hadipriono FC et al: "Implementation Of A Virtual Environment for Traffic Accident Simulation—Part II: Developing the Virtual Environment" Journal of Intelligent and Fuzzy Systems, IOS Press, Amsterdam, NL, vol. 14, No. 4, Jan. 1, 2003, pp. 203-214.

Dr. Harold Klee: "Microscopic Car Modeling For Intelligent Traffic and Scenario Generation in the UCF Driving Simulator Year 1" Project Report, Jun. 27, 2005, University of Central Florida School of Electrical Engineering and Computing Science.

Dr. Harold Klee: Microscopic Car Modeling for Intelligent Traffic and Scenario Generation in the UCF Driving Simulator Year 2 Project Report, Jun. 27, 2005, University of Central Florida School of Electrical Engineering and Computing Science.

Search Report dated Jan. 26, 2010 for App. No. EP 06 80 2866.

Cameron, GDB et al.: Paramics—Parallel Microscopic Simulation of Road Traffic, Journal of Supercomputing, Kluwer Academic Publishers, Dordrecht, NL, No. 1, Jan. 1, 1996, pp. 25-53.

Muller, K et al: 3-D Reconstruction of a Dynamic Environment with a Fully Calibrated Background for Traffic Scenes, IEEE Transactions on Circuits and Systems for Video Technology, IEE Service Center, Pascataway, NJ, US, No. 4, Apr. 1, 2005, pp. 538-549.

McCarty, WD et al: A Virtual Cockpit for a Distributed Interactive Simulation, IEEE Computer Graphics and Applications, IEE Service Center, New York, NY, vol. 14, No. 1, Jan. 1, 1994, pp. 49-54.

Supplemental European Search Report, Application No. EP 06 80 2867, dated Mar. 5, 2010.

* cited by examiner

TIME STEP 1

| VEHICLE ID | TYPE | POSITION (XYZ) |
|---|---|---|
| A | CAR | $X_{A1}, Y_{A1}, Z_{A1}$ |
| B | TRUCK | $X_{B1}, Y_{B1}, Z_{B1}$ |
| C | TRUCK | $X_{C1}, Y_{C1}, Z_{C1}$ |
| D | CAR | $X_{D1}, Y_{D1}, Z_{D1}$ |

| TRAFFIC SIGNAL | COLOR |
|---|---|
| TS1 | GREEN |
| TS2 | RED |

*FIG. 7A.*

TIME STEP 2

| VEHICLE ID | TYPE | POSITION (XYZ) |
|---|---|---|
| A | CAR | $X_{A2}, Y_{A2}, Z_{A2}$ |
| B | TRUCK | $X_{B2}, Y_{B2}, Z_{B2}$ |
| C | TRUCK | $X_{C2}, Y_{C2}, Z_{C2}$ |
| D | CAR | $X_{D2}, Y_{D2}, Z_{D2}$ |
| E | CAR | $X_{E2}, Y_{E2}, Z_{E2}$ |

| TRAFFIC SIGNAL | COLOR |
|---|---|
| TS1 | GREEN |
| TS2 | GREEN |

*FIG. 7B.*

TIME STEP 3

| VEHICLE ID | TYPE | POSITION (XYZ) |
|---|---|---|
| B | TRUCK | $X_{B3}, Y_{B3}, Z_{B3}$ |
| C | TRUCK | $X_{C3}, Y_{C3}, Z_{C3}$ |
| D | CAR | $X_{D3}, Y_{D3}, Z_{D3}$ |
| E | CAR | $X_{E3}, Y_{E3}, Z_{E3}$ |

| TRAFFIC SIGNAL | COLOR |
|---|---|
| TS1 | RED |
| TS2 | GREEN |

*FIG. 7C.*

SYSTEM AND METHOD FOR COLLECTING AND TRANSPORTING SIMULATION DATA

CROSS-REFERENCE TO RELATED APPLICATIONS

This application is a utility application which claims the benefit of priority to U.S. Provisional Application No. 60/713,693 filed on Sep. 2, 2005 which is hereby incorporated by reference.

STATEMENT REGARDING FEDERALLY SPONSORED RESEARCH OR DEVELOPMENT

Not applicable.

BACKGROUND

In the architectural industry numerous software tools are currently used throughout the engineering design process, as a means to guarantee accuracy, provide consistency, automate tedious or numerically intensive tasks, and to help visualize the resulting design. In general these tools can be categorized into design, simulation, and visualization tools. Furthermore, geographic information systems (GIS) may be applied to any of the three groups of tools.

The simulation tools are generally used to model, forecast, and analyze the movement of vehicles, people, or material goods. In aviation design, the software is used to model customer activities such as passenger movement or baggage handling and studies of landside and airside traffic. Some of the applications in transportation planning include toll plaza evaluation, freeway and corridor studies, environmental impact analysis, light and heavy rail transit studies, and ITS (intelligent transportation systems) assessments. Military applications include analysis of range training facilities and troop movement. In the newly emerging field of homeland security, applications include evacuation planning and emergency management.

The visualization tools can be categorized in two areas; 3D modeling and virtual reality (VR) software. The 3D modeling software is used to produce high end, photo realistic quality, images and animated video. The VR software is used to generate immersive environments which allow a user to freely move about and interact within a virtual world.

Both types of software are used to visualize engineering designs in numerous application areas. Advances in software and hardware technology now allow the quality of the visual images produced to contain a high degree of photo realism. GIS software provides tools which allows visualization from a geographic perspective. These tools provide the ability to compile data from many sources, to link location and information to that data, and to interpret how it interrelates.

In the development of a video or a virtual environment, an artist creates animated objects without reference to any previous data generated by use of simulation software. While a good artist can generate animated objects which may appear to be an accurate representation for the environment and circumstances, the artists do not create an accurate representation using simulation data.

SUMMARY

In one embodiment, a method for displaying simulated movement data on a graphical display in real-time is provided. Simulated movement data is received from a simulation. The type and location of each object on a graphical display is extracted from the simulated movement data for a first point in time of the simulation. An appropriate three-dimensional representation is associated with each type of object in the first point in time. Each three-dimensional representation is displayed on a graphical display according the location of each object for the first point in time of the simulation.

In another embodiment, a method for extracting and transferring object movement data in real-time is provided. Simulated movement data is received from a simulation. Time step data is extracted from the simulated movement data, where the simulated movement data comprises multiple time steps. Each time step is different point in time in the simulation. Data for a first time step is extracted from the time step data, where the data for the first time step comprises the position on a graphical display of each object within the first time step. The extracted data is transferred for the first time step.

In another embodiment, a system for displaying simulated movement data on a graphical display in real-time is provided. The system comprises an extracting component for receiving simulated movement data from a simulation and extracting a type and location of each object on a graphical interface for a first point in time of the simulation. The system further comprises an associating component for associating an appropriate three-dimensional representation for each type of object for the first point in time. The system comprises a displaying component for displaying each three-dimensional representation according the location of each object for the first point in time of the simulation.

BRIEF DESCRIPTION OF THE DRAWINGS

The present invention is described in detail below with reference to the attached drawing figures, wherein:

FIGS. 7A-7C are exemplary graphs of stored transportation simulation data in accordance with embodiments of the present invention;

DETAILED DESCRIPTION

Embodiments of the present invention are directed to systems and methods for collecting and modeling transportation simulation data Having briefly described an overview of the present invention, embodiments of the invention will be discussed with reference to FIGS. 1-10.

Figure 1:
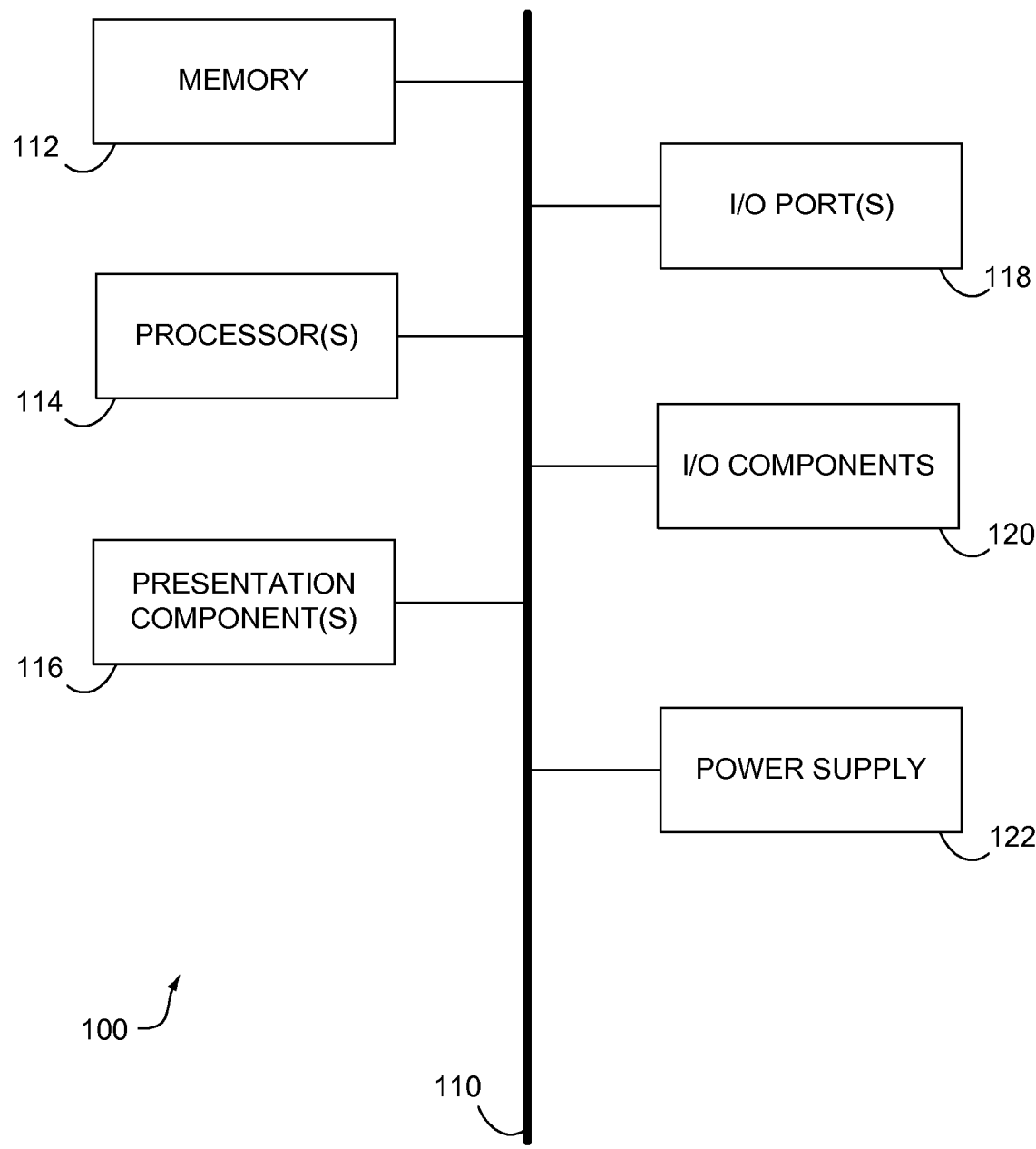
FIG. 1 is a block diagram of an exemplary computing system for use in implementing embodiments of the present invention.

Referring initially to FIG. 1 in particular, an exemplary operating environment for implementing the present invention is shown and designated generally as computing device 100. Computing device 100 is but one example of a suitable computing environment and is not intended to suggest any limitation as to the scope of use or functionality of the invention. Neither should computing device 100 be interpreted as having any dependency or requirement relating to any one or more combinations of components illustrated. In one embodiment, computing device 100 is a personal computer. But in other embodiments, computing device 100 may be a cell phone, digital phone, handheld device, personal digital assistant ("PDA"), or other device capable of executing computer instructions.

The invention may be described in the general context of computer code or machine-useable instructions, including computer-executable instructions such as program modules, being executed by a computer or other machine, such as a personal data assistant or other handheld device. Generally, program modules, including routines, programs, objects, components, data structures, and the like, refer to code that performs particular tasks or implements particular abstract data types. The invention may be practiced in a variety of system configurations, including hand-held devices, consumer electronics, general-purpose computers, more specialty computing devices, etc. It may also be practiced in distributed computing environments where tasks are performed by remote-processing devices that are linked through a communications network.

With continued reference to FIG. 1, computing device 100 includes a bus 110 that directly or indirectly couples the following devices: memory 112, one or more processors 114, one or more presentation components 116, input/output ports 118, input/output components 120, and an illustrative power supply 122. Bus 110 represents what may be one or more busses (such as an address bus, data bus, or combination thereof). Although the various blocks of FIG. 1 are shown with lines for the sake of clarity, in reality, delineating various components is not so clear, and metaphorically, the lines would more accurately be grey and fuzzy. For example, one may consider a presentation component such as a display device to be an I/O component. Also, processors have memory. We recognize that such is the nature of the art, and reiterate that the diagram of FIG. 1 is merely illustrative of an exemplary computing device that can be used in connection with one or more embodiments of the present invention. Distinction is not made between such categories as "workstation," "server," "laptop," "hand-held device," etc., as all are contemplated within the scope of FIG. 1 and are referred to as "computing device."

Computing device 100 typically includes a variety of computer-readable media. By way of example, and not limitation, computer-readable media may comprise Random Access Memory (RAM); Read Only Memory (ROM); Electronically Erasable Programmable Read Only Memory (EEPROM); flash memory or other memory technologies; CDROM, digital versatile disks (DVD) or other optical or holographic media; magnetic cassettes, magnetic tape, magnetic disk storage or other magnetic storage devices, or any other medium that can be used to encode desired information and be accessed by computing device 100.

Memory 112 includes computer-storage media in the form of volatile and/or nonvolatile memory. The memory may be removable, nonremovable, or a combination thereof. Exemplary hardware devices include solid-state memory, hard drives, optical-disc drives, etc. Computing device 100 includes one or more processors that read data from various entities such as memory 112 or I/O components 120. Presentation component(s) 116 present data indications to a user or other device. Exemplary presentation components include a display device, speaker, printing component, vibrating component, etc.

I/O ports 118 allow computing device 100 to be logically coupled to other devices including I/O components 120, some of which may be built in. Illustrative components include a microphone, joystick, game pad, satellite dish, scanner, printer, wireless device, etc.

Figure 2:
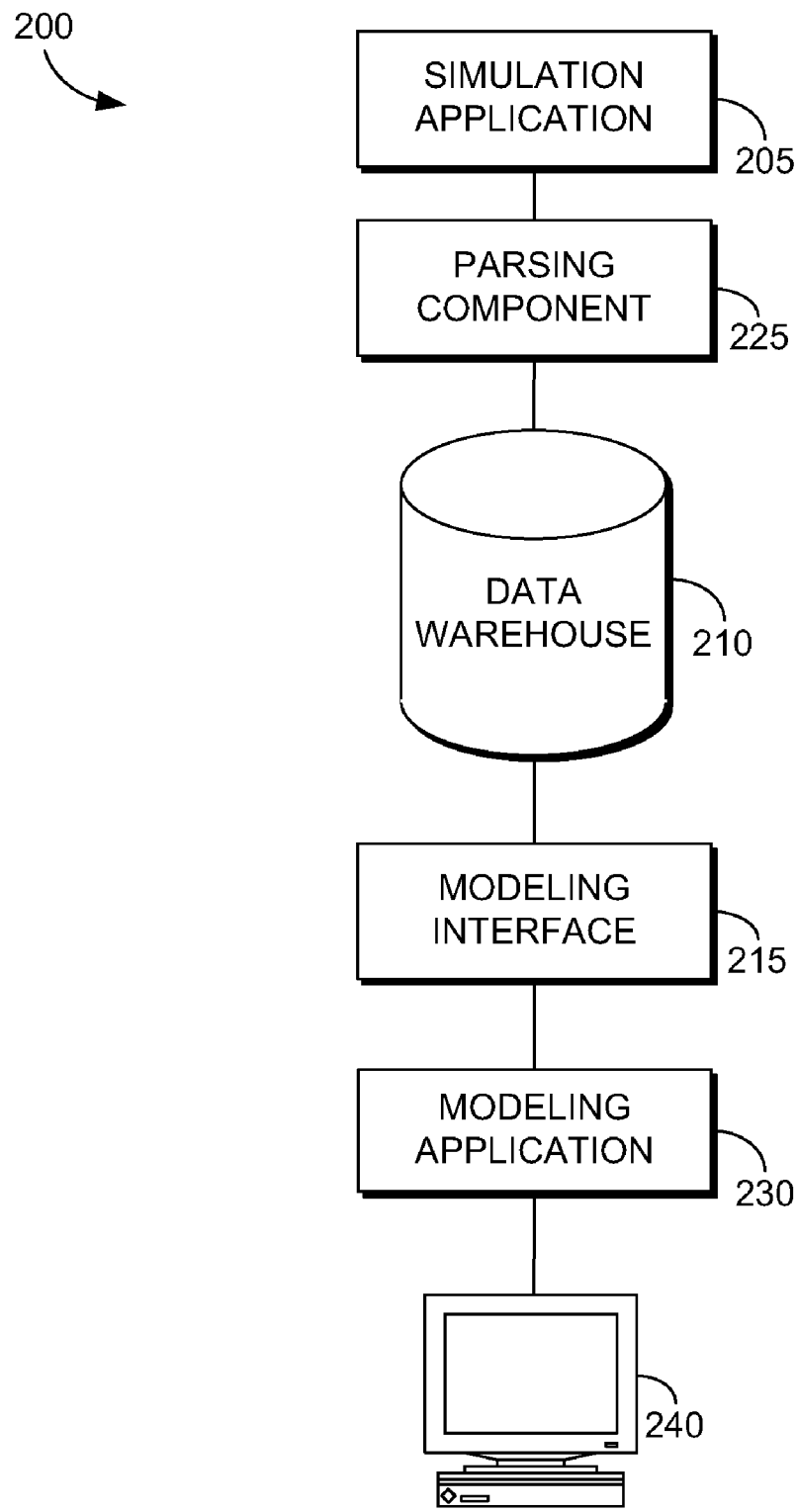
FIG. 2 is a block diagram of an exemplary system including a database for storing simulation data for use in implementing embodiments of the present invention.

Referring next to FIG. 2, a block diagram of an exemplary system for use in implementing one or more embodiments of the present invention is shown. A system 200 comprises an extraction application 225, a data warehouse 210 and a modeling interface 215. The extraction application 225 is in communication with a simulation application 205 and database 210. Modeling interface 215 is in communication with data warehouse 210 and a modeling application 230. Modeling application 230 may be in communication with or located on a remote computer 240 to be used by a user. The user may be, but is not limited to, an architect, engineer, military personnel, airport personnel, and transportation personnel. It will be appreciated that while extraction application 225 and modeling interface 215 are shown as being stand-alone, extraction application 225 may be integrated with simulation application 205 and modeling interface 215 may be integrated with modeling application 230.

A simulation program is run from the simulation application 205. A variety of simulation application may be utilized including VISSIM™ by PTV, Inc. For example, a simulation of a possible traffic pattern at a given intersection at a given point during the day may be created.

The simulation data from the simulation program is utilized by extraction application 225. The extraction application 225 extracts static and time step data from the simulation. Static data is information regarding traffic signal locations in a traffic simulation. Time step data is data for a given time point within the simulation and contains information as to the identification of objects, type of objects and location of objects within a graphical display for the time step.

After the data is extracted by extraction application 225 it is stored in data warehouse 210. Although depicted as one data warehouse it will be appreciated that data warehouse 210 may be multiple databases rather than just one.

Modeling interface 215 utilizes the data from data warehouse 210 and communicates with modeling application 230.

Exemplary modeling applications include 3DS by Autodesk, Inc. Modeling application 230 may also include geographic information systems such as ARCINFO by ERSI. The modeling application 230 includes 3-dimensional representations of objects in the form of images and drawings. Three-dimensional representations of include depth, width, and height of an object. Modeling interface 215 utilizes the simulation data stored in data warehouse 210 to create a traffic pattern from the stored simulation data and associates the proper 3-dimensional object accessed from the modeling application 230 to create a simulated traffic pattern with 3-dimensional objects. The simulated traffic pattern with 3-dimensional objects may be displayed on a graphical display of a user's computer 240.

Figure 3:
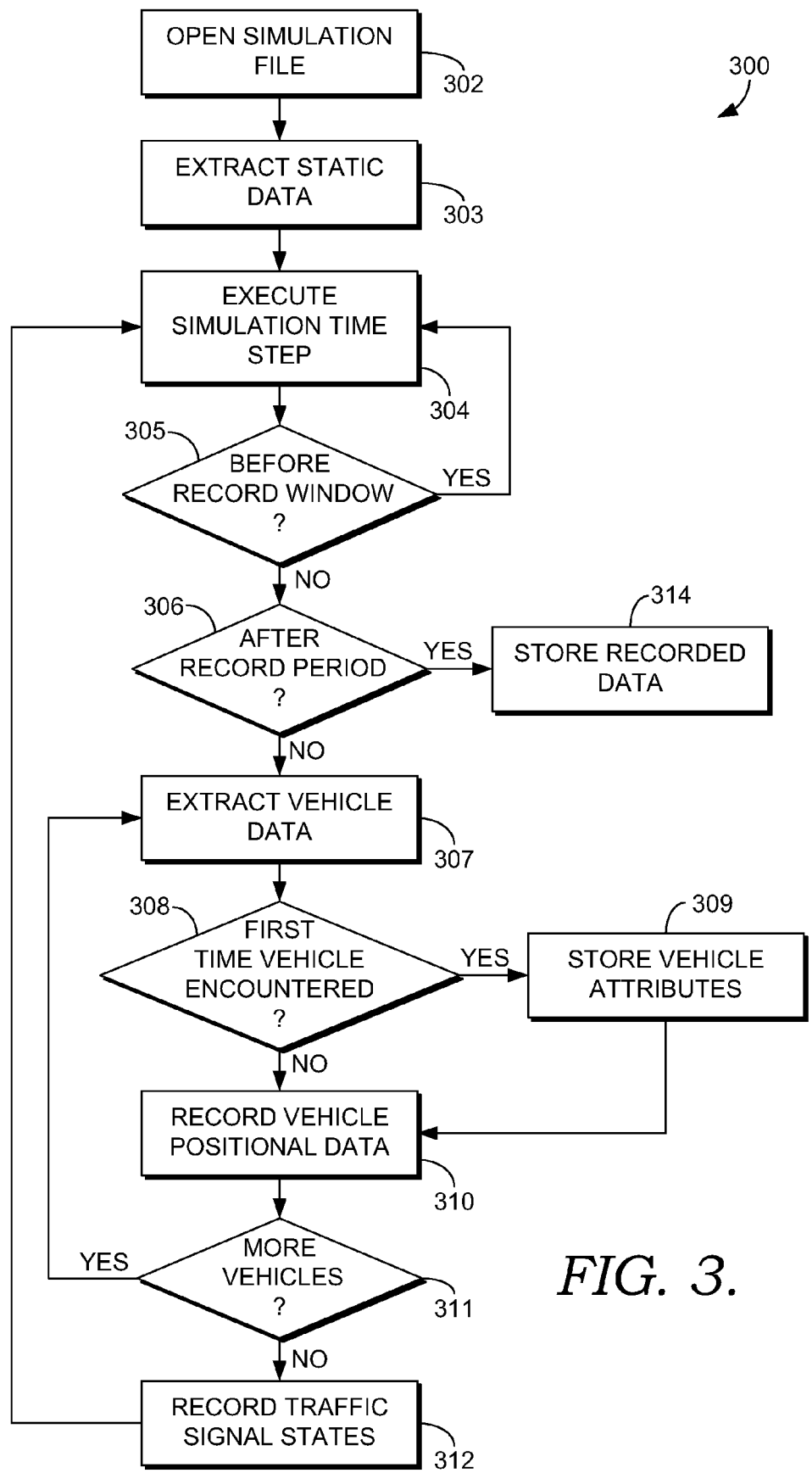
FIG. 3 is a flow diagram of a method for extracting and storing simulation data in a database in accordance with an embodiment of the present invention.

With reference to FIG. 3, a method 300 for extracting and storing traffic simulation data is shown. While FIGS. 3 and 4A-4C are described with reference to vehicles as the moving objects, it will be appreciated that any variety of simulated moving objects may be used with the methods of FIGS. 3 and 4A-4C such as people, baggage, military personnel and the like. At step 302, a simulation file is opened. At step 303, static data is extracted from the simulation file. The static data refers to the location of traffic signals within the simulation.

At step 304, a simulation time step is executed. The simulation is made up of time steps. A simulation time step is a different point in time of the simulation. It may be designated that simulation data be recorded for a certain period of time and that only time steps executed during that period be utilized with the present method. Thus, at step 305, it is determined whether the executed time step is before the recording period. For example, the executed time step may be during a warm-up period and not during the designated recording period. At step 306, it is determined whether the executed time step is after the designated recording period. If the time step is within the designated recording period, at step 307, vehicle data for a vehicle within the executed time step is extracted. The vehicle data for a vehicle within the executed time step may include identification of the vehicle, type of vehicle and position of vehicle.

At step 308, it is determined whether this is the first time the vehicle has been encountered within the simulation or if the vehicle has been encountered at previous time steps for the simulation. If this is the first time the vehicle has been encountered, at step 309, the vehicles attributes, such as type of vehicle, are recorded. After the attributes of the vehicle have been recorded, the position of the vehicle within the time step is recorded at step 310.

If at step 308, it is determined that this is not the first time the vehicle has been encountered within the simulation and the vehicle has been encountered before, the method proceeds directly to step 310 to record the position of the vehicle within the time step. At step 311, it is determined whether there are any additional vehicles within the time step to record vehicle data. If so, the method proceeds to step 307 to extract vehicle data for another vehicle within the time step. This process continues until data for all the vehicles within a time step has been extracted and recorded. If it is determined at step 311, that there are no more vehicles to extract data from for the time step, at step 312, any traffic signal states for the time step are recorded.

The system then proceeds to extract data for another time step at step 304. After the vehicle data for all the vehicles for all the time steps within the designated recording period has been extracted and recorded, the system proceeds to step 314 to store the record data. Thus, if the next executed step is after the record period, it is determined that the designated record period has ended and all recorded data for the time steps within the designated record period is stored in a database at step 314. Data may be stored in a formal database such as Microsoft® Access or stored in a file using a generic format such as extensive markup language (XML). Exemplary database tables for individual time steps are shown in FIGS. 7A-7C.

Figure 4A:
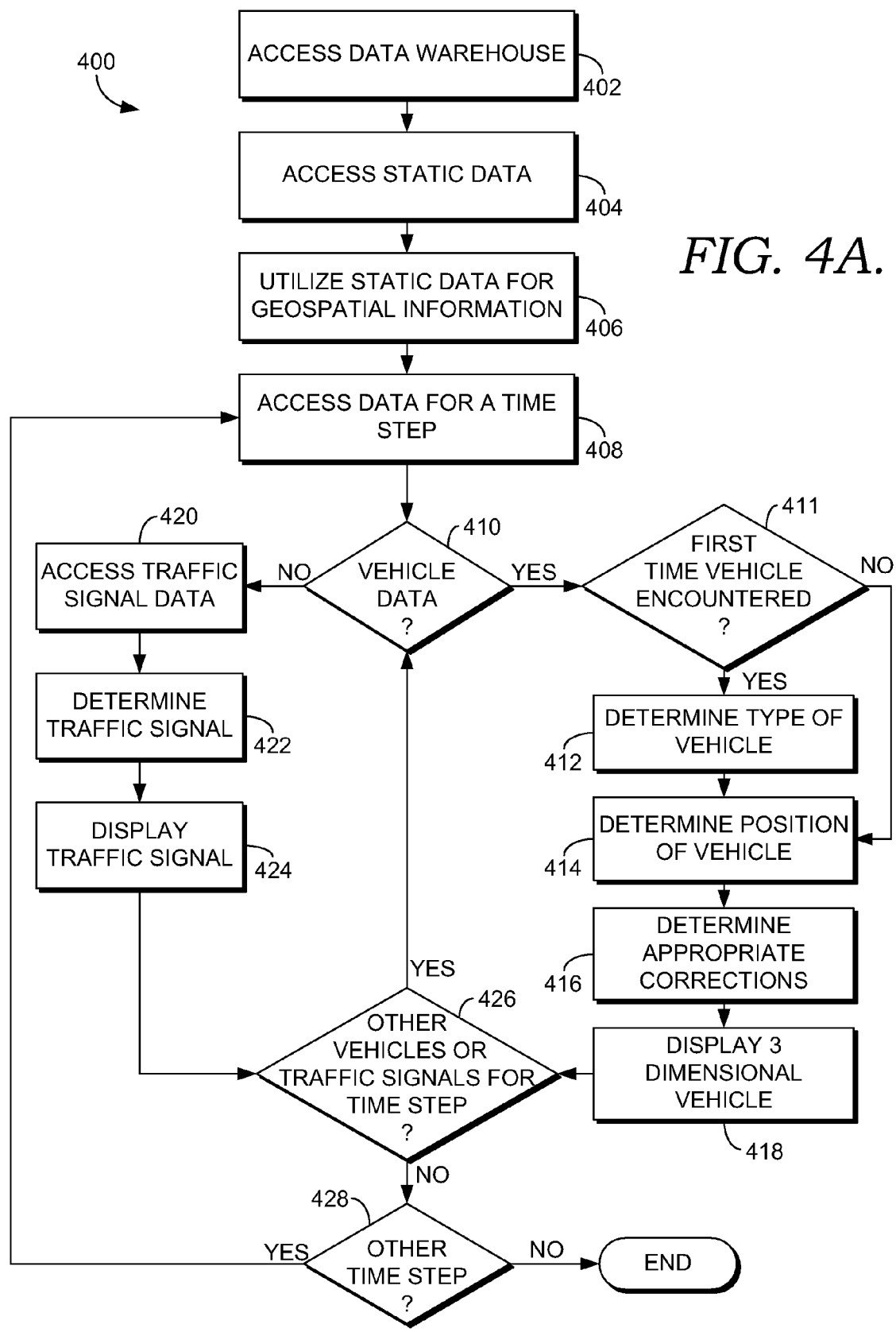
FIG. 4A is a flow diagram of a method for accessing and displaying three-dimensional transportation simulation data in accordance with an embodiment of the present invention.

With reference to FIG. 4A, a method 400 for accessing stored traffic simulation data and displaying representations of 3-dimensional vehicles in a simulated traffic pattern is shown. At step 402, a data warehouse containing data extracted and stored for a recorded simulation time period is accessed. The traffic simulation data may be extracted and stored according to the method of FIG. 3. At step 404, static data for the traffic simulation is accessed. The static data includes the location of traffic signals within the simulation. The data regarding the location of the traffic signals is utilized to position the traffic signals within the graphical representation at step 406.

At step 408 data for a time step in the simulated traffic data is accessed. As described above, a time step is a moment of time in the simulation. For example, if a time step constitutes 0.1 of a second and the simulation is 30 seconds, there are 300 time steps for the simulation. It will be appreciated that a time step may be any length of time. For each individual time step, the number of vehicles, type of vehicles and location of the vehicles is documented in the database as described in the method of FIG. 3. For each time step, data for all of the vehicles and traffic signals is accessed. For example, with reference to FIGS. 7A-7C, extracted data for an exemplary time step of a simulation is shown. For time step 1, there are four vehicles A-D. The type of vehicle and position (XYZ coordinates) of each vehicle displayed for the simulation are included. Also for time step 1, the state of all traffic signals in the exemplary time step is included.

At step 410, it is determined whether the data is for a vehicle. If so, at step 411, it is determined whether this is the first time the vehicle has been encountered in the process. For example, the vehicle may have been encountered in one or more previous time steps accessed from the database for displaying simulated vehicles within the same designated recording period for the simulation. If at step 411 it is determined that the vehicle has not been encountered before, at step 412, the type of vehicle is determined and the corresponding 3-dimensional vehicle to be displayed is determined. For example, the modeling interface 215 of FIG. 2, accesses a modeling application 230 for an appropriate 3-dimensional picture or drawing of the type of vehicle determined. For example, referring to FIG. 7A, if vehicle A is determined to be a car, a 3-dimensional object representing a car is accessed from a modeling application 230 of FIG. 2. After determining the corresponding 3-dimensional vehicle for the type of vehicle, the process proceeds to step 414.

If the vehicle has been previously encountered at step 411, at step 414, the position of the vehicle is determined and the appropriate placement of the vehicle within the graphical display is determined. For example, the position of vehicle A of FIG. 7A is determined to be the coordinates $X_{A1}$, $Y_{A1}$ and $Z_{A1}$. The 3-dimensional representation of the vehicle is positioned within the graphical display according to the position determined. At step 416, the appropriate corrections for the vehicle are determined. Appropriate corrections need to be made when displaying a 3-dimensional representation of a vehicle from a modeling application based on the simulation data. For example, the pitch, heading, roll, and corrections for turns for the 3-dimensional vehicle image need to be adjusted accordingly so that they are displayed properly on the graphical display.

Figure 8A:
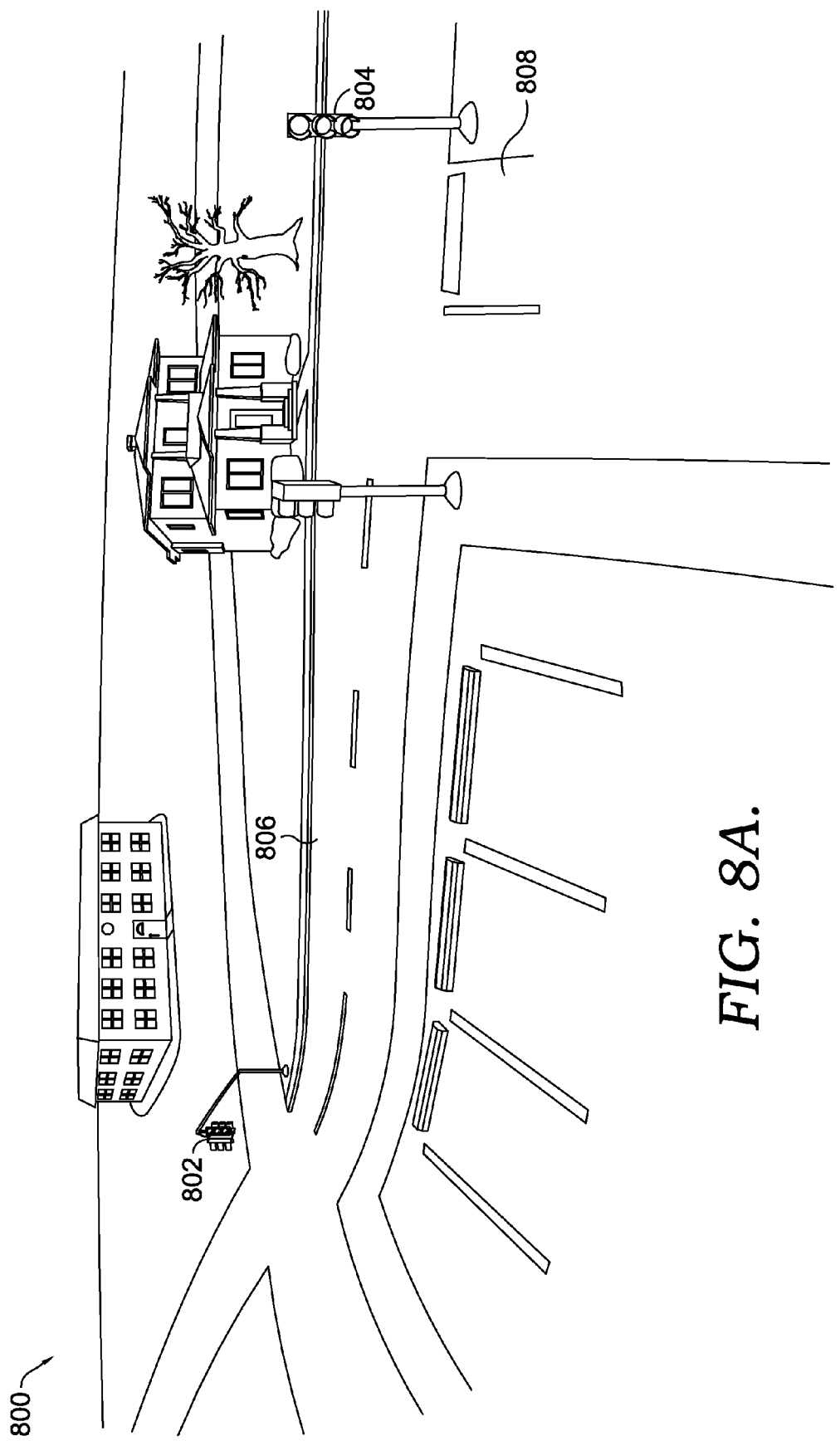
FIG. 8A is an exemplary graphical display without 3-dimensional vehicles in accordance with an embodiment of the present invention.
Figure 8B:
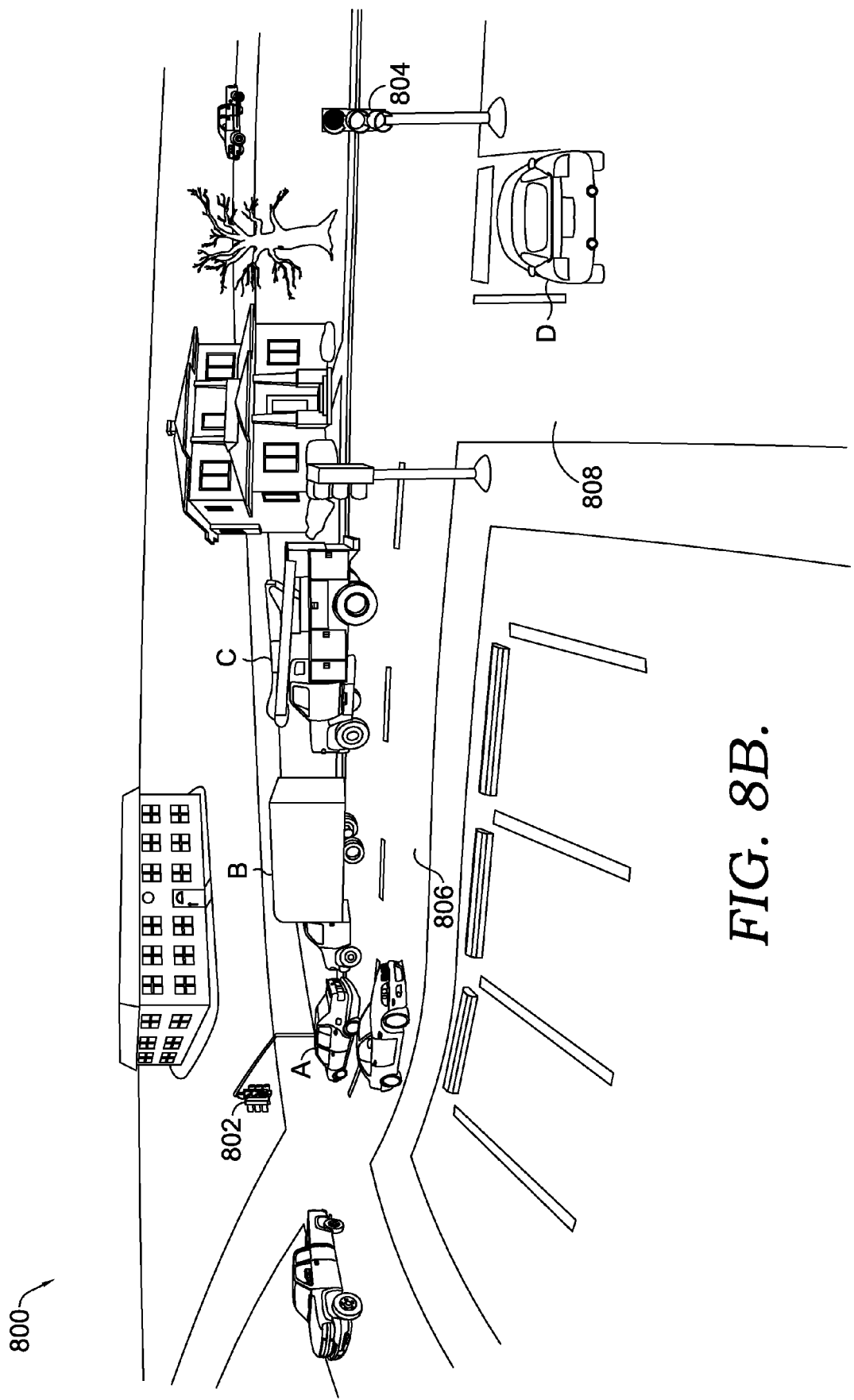
FIGS. 8B-8D are exemplary graphical display including simulated 3-dimensional vehicle representations in accordance with embodiments of the present invention.

At step 418, the 3-dimensional vehicle representation is displayed in the appropriate position with any necessary corrections in a graphical display. For example, the 3-dimensional vehicle representation is displayed on a graphical display such as the one shown in FIG. 8A. The graphical display of FIG. 8A is generated by a modeling application, such as modeling application 230 of FIG. 2. With reference to FIG. 8A, an exemplary graphical display to be used with simulated traffic vehicles is shown. The graphical display may include roadways, turn lanes, road signs, overpasses, bridges, train tracks, bodies of water, trees and foliage, traffic light locations, parking lot locations, buildings and building locations. The exemplary display may include any other number of items and locations needed for displaying simulated traffic vehicles. These items are accessed from modeling application 230 of FIG. 2. The exemplary graphical display in FIG. 8A includes two roadways 806 and 808 and two traffic signals 802 and 804. Referring next to FIG. 8B, an exemplary graphical display 800 with 3-dimensional vehicle representations is shown. The graphical representation includes vehicle A, a car in position $X_{A1}$, $Y_{A1}$ and $Z_{A1}$, as accessed and determined from FIG. 7A.

At step 426, it determined whether there are any other vehicles or traffic signals for the time step that need to be determined and displayed. If so, the method returns to step 410 to access data for the time step. If not, at step 428, it is determined whether there are any other time steps for the simulation data that need to be displayed and, if so, the method accesses data for a subsequent time step at step 408.

Returning to step 410, if at step 410 it is determined that the data is not for a vehicle, the system accesses the traffic signal data at step 420 and determines the state of a traffic signal for the time step at step 422. For example, referring to FIG. 7A, traffic signal 1 is determined to be green in time step 1 of the simulation data. At step 424, the state of the traffic signal is displayed. For example, with reference to FIG. 8B, a green state for traffic signal 1 (802) is displayed in the graphical display 800. At step 426 of FIG. 4, it is determined whether there is any other vehicles or traffic signal data for the time step to be accessed, to be determined and displayed.

Figure 4B:
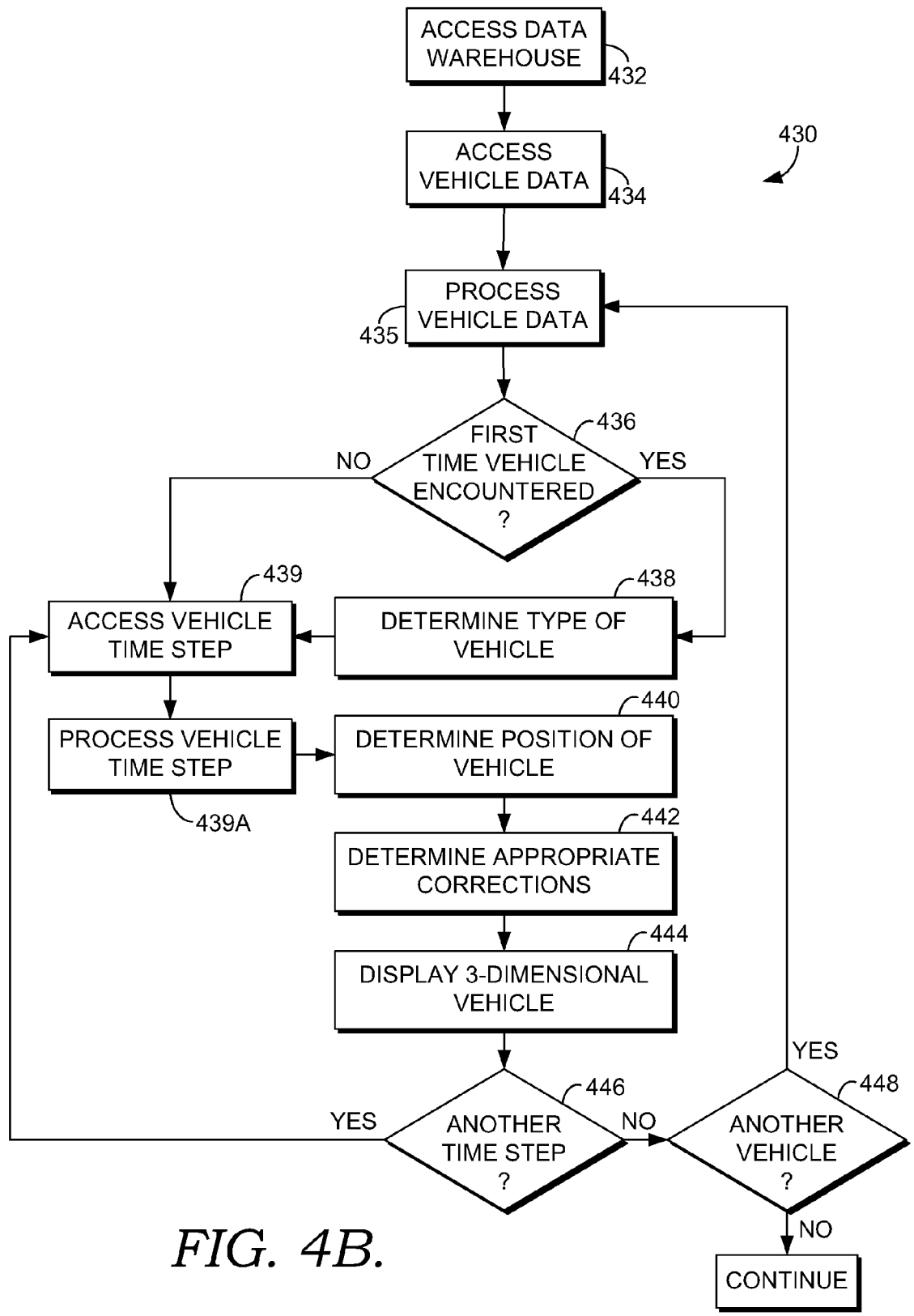
FIG. 4B is a flow diagram of a method for accessing and displaying three-dimensional vehicle simulation data in accordance with an embodiment of the present invention.

With reference to FIG. 4B, in another embodiment, method 430 for accessing stored traffic simulation data and displaying representations of 3-dimensional vehicles in a simulated traffic pattern by determining the pathway of a vehicle in a simulation is shown. At step 432, a data warehouse, such as database 210 of FIG. 2, is accessed. At step 434, data for an individual vehicle throughout a simulation is accessed. For example, data for all time steps for vehicle A in which vehicle A is displayed in the simulation is accessed. At step 435, the data for the vehicle is processed. At step 436, it is determined whether this is the first time the vehicle has been encountered. For example, with reference to the exemplary database of FIG. 7A, this is the first time vehicle A has been encountered in the simulation. If so, at step 438 the type of vehicle is determined and the system proceeds to step 439.

If this is not the first time the vehicle has been encountered, the system proceeds to step 439 to access the vehicle's time step and at step 439A processes the vehicle time step. At step 440 based on the vehicle time step, the position of the vehicle is determined. For example, with reference to the exemplary database of FIG. 7B, vehicle A has already been encountered in time step 1, so only the location of vehicle A needs to be determined for time step 2. At step 442, appropriate corrections to the 3-dimensional vehicle representation such as pitch, roll and heading, are determined. At step 444, a 3-dimensional representation of the vehicle is displayed on a graphical display in the proper location for the designated time step with any corrections.

At step 446, it is determined whether the vehicle is displayed in any other time steps. If so, the system proceeds to step 439 to access the vehicle time step for the next time step. This process continues until the position of the vehicle for all time steps in the simulation period have been determined and displayed accordingly. For example, with reference to FIGS. 7A-7C, data for vehicle A is accessed for time step 1 (FIG. 7A) and time step 2 (FIG. 7B). As vehicle A is not in time step 3 (FIG. 7C), data for vehicle A is not accessed for time step 3.

If at step 446 it is determined that the vehicle is not displayed in any other time steps, at step 448, it is determined if there are any other vehicles for the simulation to determine their pathways through the simulation. If so, the process returns to step 435 and determines the pathway for the next vehicle.

Figure 4C:
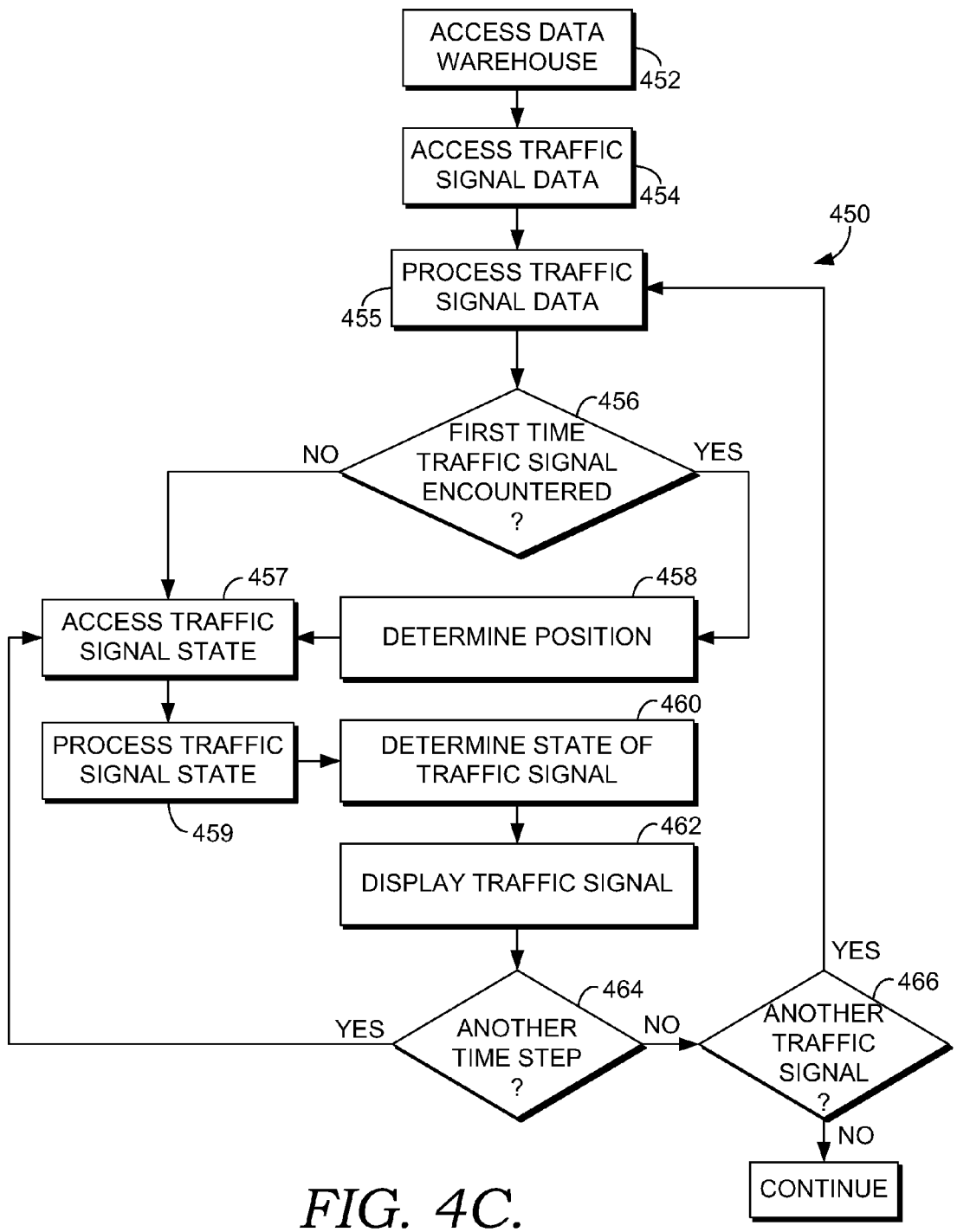
FIG. 4C is a flow diagram of a method for accessing and displaying simulated traffic signal data in accordance with an embodiment of the present invention.

Referring next to FIG. 4C, a method 450 for accessing stored traffic simulation data and displaying the states of traffic signals in a simulated traffic pattern is shown. At step 452, a data warehouse, such as database 210 of FIG. 2, is accessed. At step 454, traffic signal data is accessed. At step 455, the traffic signal data is processed. Traffic signal data includes the traffic state for a time step in a simulation. At step 456, it is determined whether this is the first time a traffic signal has been encountered. For example, it is determined whether the traffic signal has been encountered before for the simulation time period. If so, at step 458 the position of the traffic signal is determined. Then the system proceeds to step 457.

If at step 456, it is determined that it is not the first time the traffic signal has been encountered, the process proceeds to step 457. At step 457, the traffic signal state for the time step is accessed and at step 459 the traffic signal state is processed. At step 460, utilizing the information accessed from steps 457 and 459, the position of the traffic signal in a graphical display is determined. Then at step 462, the state of the traffic signal is displayed. The state of the traffic signal may be displayed on a graphical display such as the one shown in FIG. 8B.

At step 464, it is determined whether the traffic signal is involved in other time steps, if so, the method returns to step 457. If it is determined that the traffic signal is not involved in any other time steps, at step 466 is determined whether the state of any other traffic signal needs to be determined for the simulation. If so, the process returns to step 455 to determine the state of the traffic signal throughout the simulation.

Figure 5:
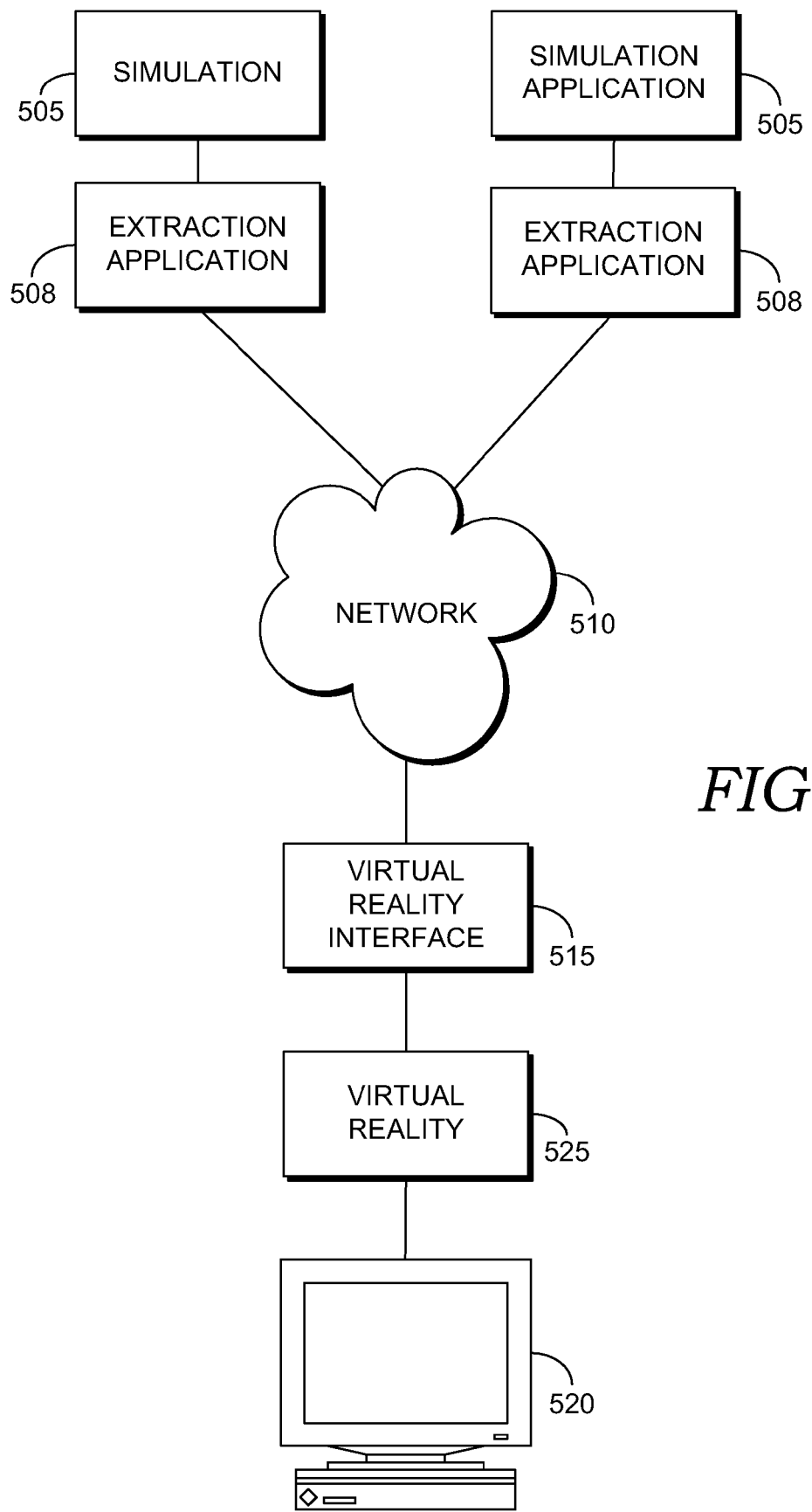
FIG. 5 is a block diagram of an exemplary system utilizing simulation data in real-time for use in implementing embodiments of the present invention.

Referring next to FIG. 5, a block diagram of an exemplary system utilizing real-time simulation data for use in implementing one or more embodiments of the present invention is shown. A system converts simulated object movement data into 3-dimensional representations as the data is received rather than accessing the data already extracted and stored in a database. Each extraction application 508 is in communication with one simulation application 505 and virtual reality interface 515 via network 510. Virtual reality interface 515 also is in communication with a virtual reality application 525. Virtual reality application 525 may be in communication with or located on a remote computer 520 to be used by a user.

A simulation file is opened by extraction application 508 to run a simulation. For example, a simulation of a possible traffic pattern at a given intersection at a given period during the day may be created. The extraction application 508 executes a time step for the simulation and the data for the step is assigned to a step scanners queue. As this is done in real-time, there are multiple step scanner's to assign time steps to for the extraction of data. For example, with reference to FIG.

9, there are ten (10) step scanners. However, it will be appreciated that there may be any number of step scanners.

Each time step for a simulation after it is executed is assigned to a step scanner. Each step scanner is divided into a number of worker threads. For example, a first step scanner may be divided into three (3) worker threads. If there are thirty (30) vehicles in a time step assigned to a step scanner, ten (10) vehicles would be assigned to each worker thread. Assigning time steps to step scanners and then further assigning vehicles to worker threads increases efficiency. After the vehicles for a time step are assigned to a worker thread, the data for the vehicles is extracted and the vehicle history, such as identification of the vehicle, type of vehicle and position of the vehicle, is extracted.

After the data has been extracted, the data is transferred via a connection, such as a pipe, to the virtual reality interface 515 for accessing the virtual reality application 525 and accessing the correct 3-dimensional object representation. Multiple connections may be used to increase speed in which extracted data may be transferred. For example, if there are three connections between the extraction application 508 and the virtual reality interface 515, a thread that has completed extracting data for assigned objects can utilize a connection that is not currently being utilized by another thread.

As the extracted data is received by the virtual reality interface 515 from the extraction application 508, the virtual reality interface utilizes the extracted data and associates the proper 3-dimensional object accessed from the virtual reality application 525 to create a simulated traffic pattern with 3-dimensional representation. Exemplary virtual reality applications include Vega Prime by MultiGen-Paradigm, Inc. It will be appreciated that virtual reality applications create 3-dimensional objects and may include real-time 3-dimensional modeling applications. The virtual reality interface utilizes the extracted simulation data received to create a traffic pattern from the parsed simulation data and associates the proper 3-dimensional object accessed from the virtual reality application 525 to create a simulated traffic pattern with 3-dimensional objects in real-time. The simulated traffic pattern with 3-dimensional objects may be displayed by the virtual reality application 525 on a graphical display on a user's computer 520.

Figure 6A:
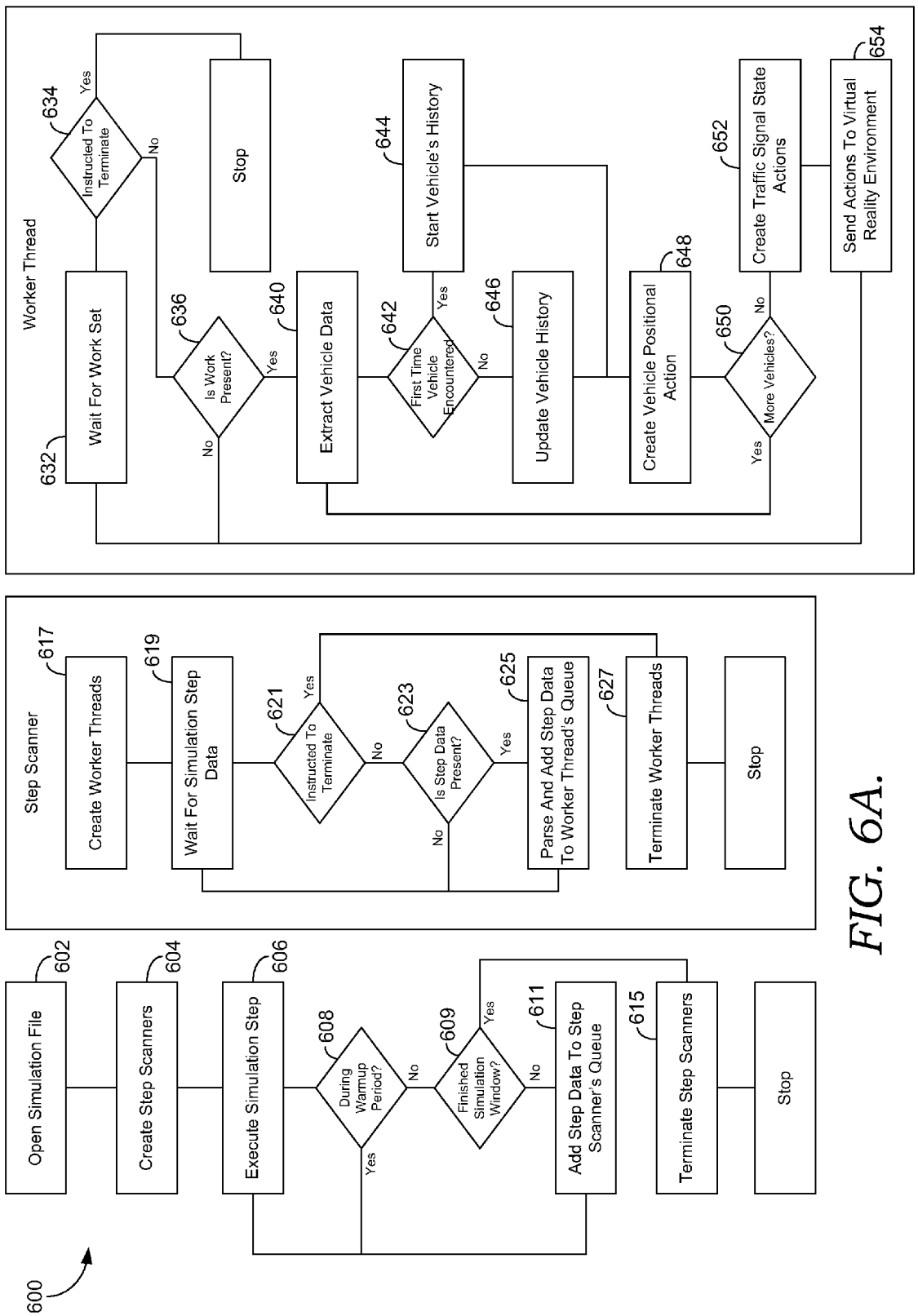
FIG. 6A is a flow diagram of a method for extracting simulation data in real-time in accordance with an embodiment of the present invention.
Figure 9:
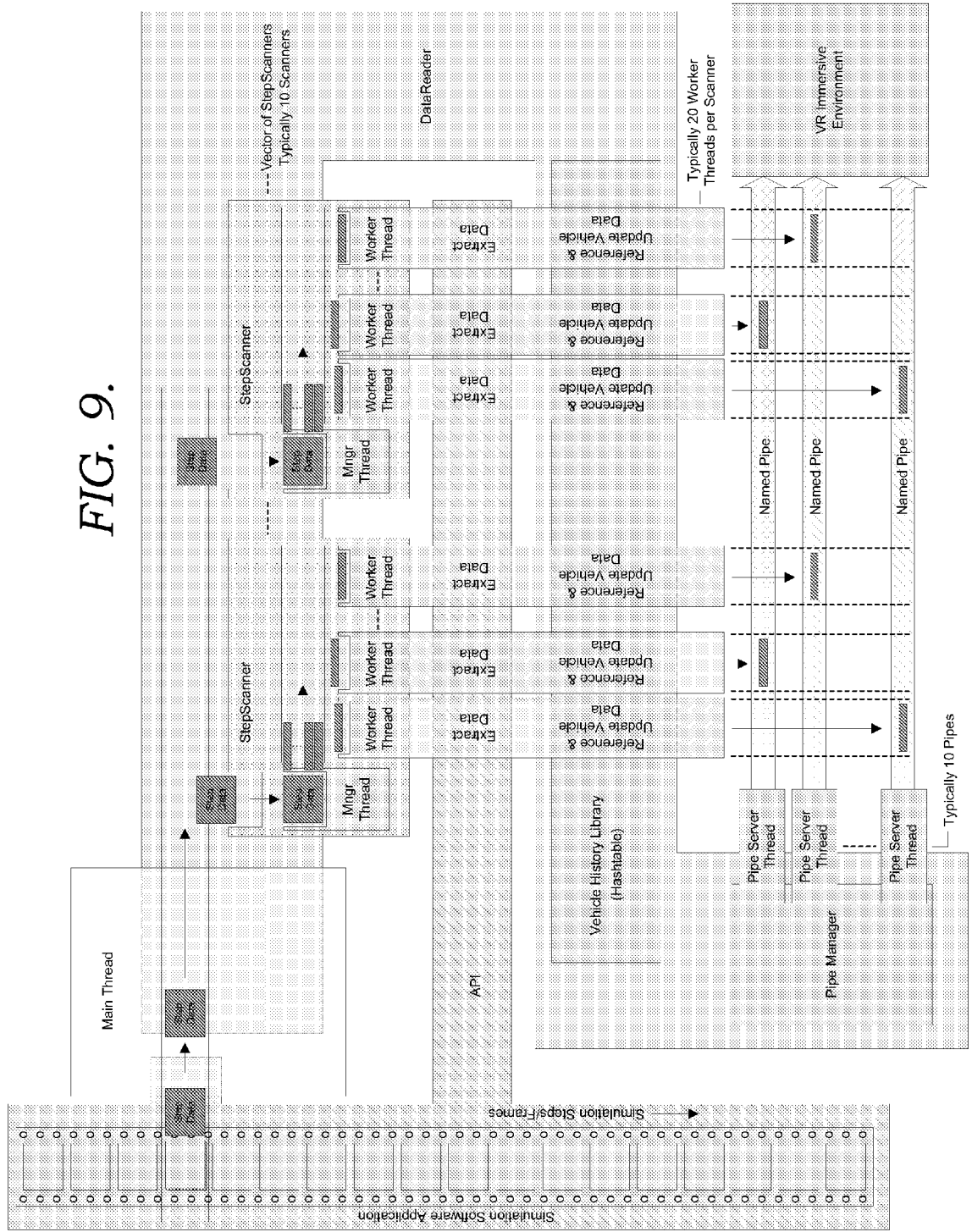
FIG. 9 is a graphical representation of the method described in FIG. 6A in accordance with an embodiment of the present invention.

With reference to FIG. 6A, a method 600 for extracting simulation data in real time is shown. FIG. 9 is a graphical representation of the method described in FIG. 6A. At step 602, a simulation file is opened. At step 604, step scanners are created. At step 606, a simulation time step is executed. The simulation is made up series of time steps. Objects move or change positions during a simulation. For example, a vehicle may change positions and be located at a different location for each time step of a simulation. A specific recording period for extracting and recording data for the simulation may be designated such that only time steps executed during that period may be utilized with the present method. Thus, at step 608, it is determined whether the executed time step is before the recording period. For example, the executed time step may be during a warm-up period and not during the designated recording period. If so, the method waits until the simulation step executed is within the designated recording period.

Once a simulation time step is determined to not be within a warm-up period, at step 609, it is determined whether the executed time step is after the designated recording period. If at step 609, it is determined that the executed time step is within the designated recording period, the data for the time step is assigned to the step scanner's queue at step 611. If at step 609, it is determined that the executed time step is after the designated record period, than any step scanners are terminated at step 615.

Within the step scanner, the step scanner is divided into worker threads at step 617. The step scanner waits to receive simulation time step data at step 619 until it is instructed to terminate at step 621. If the step scanner is not instructed to terminate, then at step 623, the step scanner determines whether any time step data is present. In other words, the step scanner determines whether data for a time step has been assigned to its queue. If step data is present and has been assigned to the step scanners' queue at step 623, at step 625 the step scanner parses the time step data and adds the parsed data to queues for the worker threads. In other words, if the time step data includes vehicle data, the step scanner assigns vehicles within the time step to a queue where worker threads retrieve work. For example, if there are three worker threads for a step scanner and thirty (30) vehicles for a time step assigned to the step scanner, then each worker thread will extract data for (10) vehicles in the simulated time step.

Within each worker thread, the worker thread waits for a work set at step 632 until it is instructed to terminate at step 634. At step 636, the worker thread determines whether work is present. In other words, the worker thread determines whether any objects or vehicles have been assigned to its queue. If work is present at step 640, the worker thread extracts vehicle data for a vehicle in its queue. At step 642, it is determined whether this is the first time a vehicle has been encountered in the simulation. If so, at step 644, the worker thread starts the vehicle's history. Starting the vehicles history includes extracting the type of vehicle and the position of the vehicle for the time step. If this is not the first time a vehicle has been encountered, at step 646, the vehicle's history is updated. For example, the location of the vehicle within the time step is updated. At step 648, a vehicle positional action is created.

After a vehicle positional action is created, then at step 650, the worker thread determines whether any more vehicles remain in its queue. If so, the worker thread extracts data for the next vehicle in its queue at step 640. If there are no more vehicles in the worker thread's queue, the worker thread creates traffic signal state actions at step 652. In other words, the worker thread extracts the state of the traffic signal from the time step data. At step 654, the vehicle data and traffic signal data extracted by the worker thread is sent to a virtual reality environment, such as virtual reality interface 515 of FIG. 5.

Figure 6B:
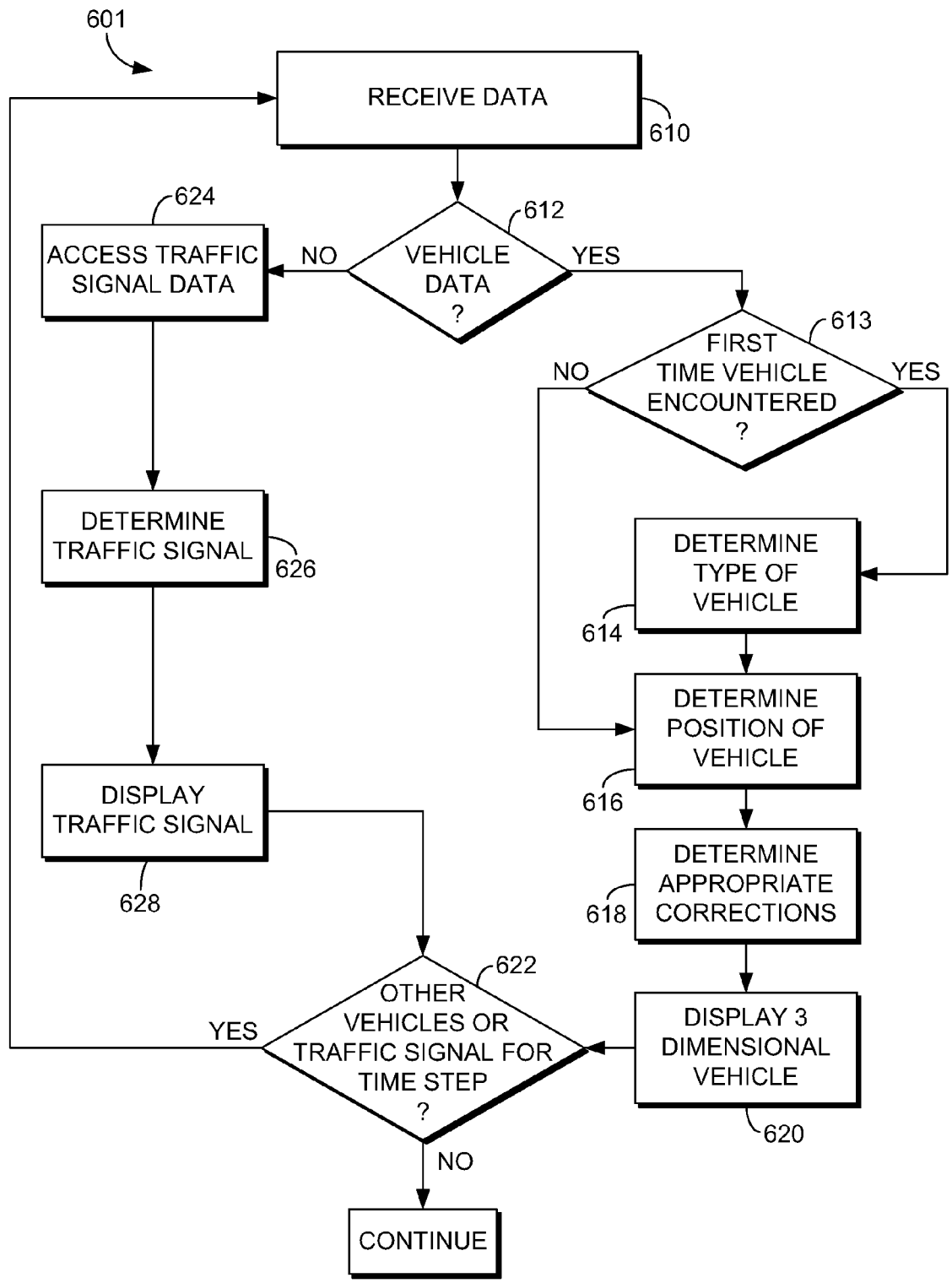
FIG. 6B is a flow diagram of a method for receiving and displaying three dimensional transportation simulation data in real-time in accordance with an embodiment of the present invention.
Figure 10:
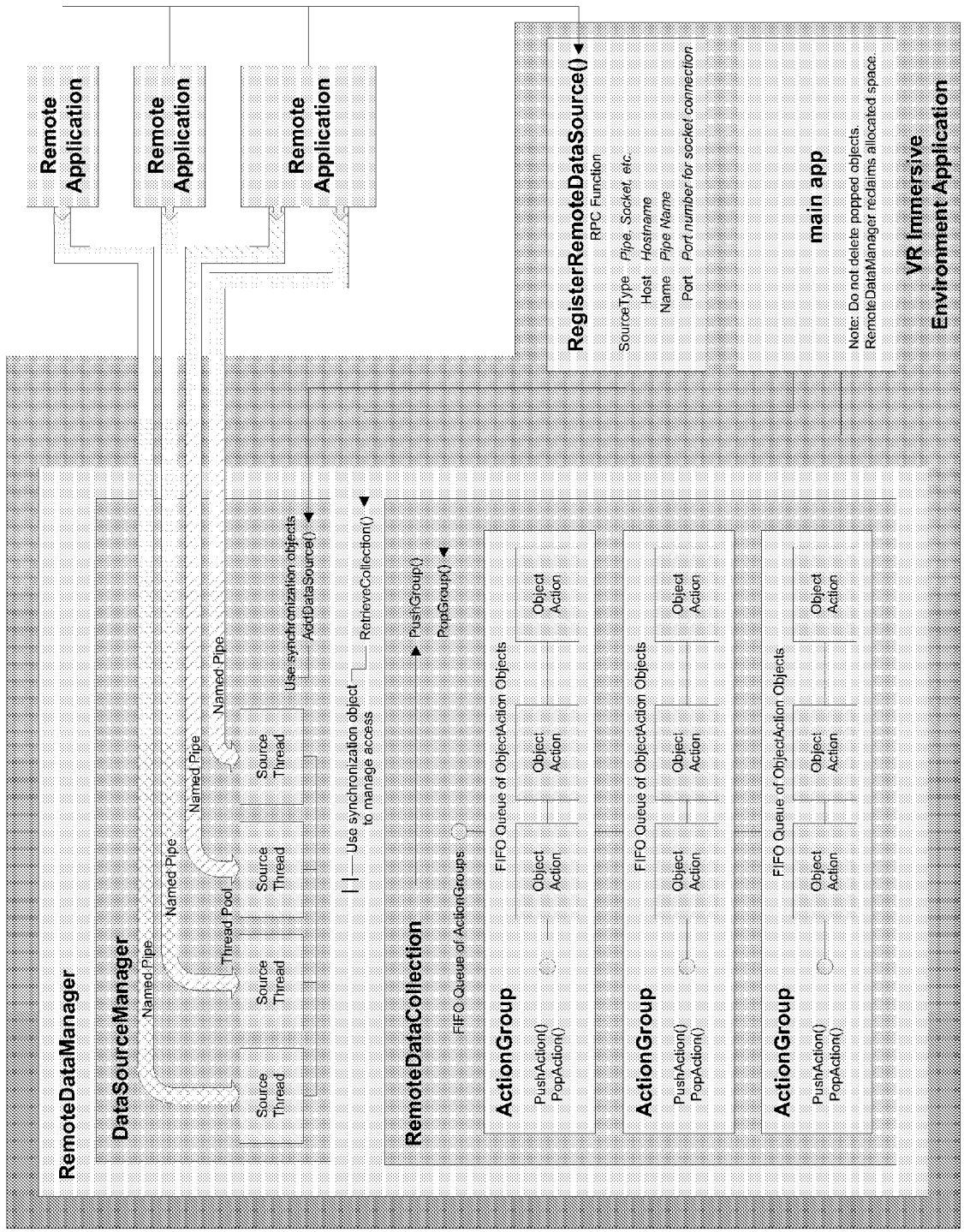
FIG. 10 is a graphical representation of the method described in FIG. 6B in accordance with an embodiment of the present invention.

Referring next to FIG. 6B, a method 601 for receiving extracted traffic simulation data and displaying 3-dimensional vehicles in a simulated traffic pattern in real-time is shown. FIG. 10 is a graphical representation of the method according to FIG. 6B. While FIG. 6B is described with reference to vehicles and traffic signals as the moving objects, it will be appreciated that any variety of simulated moving objects may be used with the method of FIG. 6B such as people, baggage, military personnel and the like. At step 610, vehicle and traffic signal data extracted according to the method described in FIG. 6A is received.

At step 612, it is determined whether the data received is for a vehicle. At step 613, it is determined whether this is the first time the vehicle has been encountered for the simulation. If so, at step 614, the corresponding 3-dimensional vehicle to be displayed is determined. For example, the virtual reality interface 515 of FIG. 5, accesses a modeling application for an appropriate 3-dimensional picture or drawing of the type of vehicle. For example, referring to FIG. 7A, if vehicle A is determined to be a car, a 3-dimensional object representing a car is accessed from a virtual reality application 525. The system then proceeds to step 616.

If at step 613 it is determined that the vehicle has been encountered before for the simulation period, at step 616, the position of the vehicle is determined and the appropriate placement of the vehicle within the graphical display is determined. For example, the position of vehicle A of FIG. 7A is determined to be the coordinates $X_{A1}$, $Y_{A1}$ and $Z_{A1}$. The 3-dimensional vehicle is positioned within the graphical display according to the position determined. At step 618, the appropriate corrections for the vehicle are determined. Appropriate corrections need to be made 3-dimensional image obtained from a virtual reality application 525 when the 3-dimensional representations are utilized with simulation data. For example, the pitch, heading and roll of the 3-dimensional vehicle image need to be adjusted accordingly so that it has the correct orientation.

At step 620, the 3-dimensional vehicle in the appropriate position with any necessary corrections is displayed within a graphical display. At step 622, it determined whether there are any other vehicles or traffic signals for the time step that need to be determined and displayed. If so, the method returns to step 610 to receive data. If not, the system continues.

Returning to step 612, if at step 612 it is determined that the extracted time step data is not for a vehicle, the system accesses the traffic signal data at step 624 and determines the traffic signal state for the time step at step 626. For example, referring to FIG. 7A, traffic signal 1 is determined to be green in time step 1 of the simulation data. At step 628, the state of the traffic signal is displayed. For example, with reference to FIG. 8B, a green color for traffic signal 1 (802) is displayed in the graphical display 800.

By way of example, and not limitation, with reference to FIG. 4A, an exemplary method 400 for accessing extracted time step data is shown. At step 408, data for a time step of the simulation is accessed. For example, with reference to FIG. 7A, data for time step 1 is accessed. It will be appreciated FIG. 7A has been truncated for discussion purposes and shows data only for vehicles A-D. FIG. 7A, if it not truncated for discussion purposes, would include vehicle data, such as type and position, for all vehicles shown in FIG. 8B.

At step 410, it is determined whether the data is for a vehicle. At step 411, it is determined whether vehicle A has been encountered before. As vehicle has not been encountered before, at step 412, it is determined that vehicle A is a car and the appropriate 3-dimensional vehicle is obtained. At step 414 it is determined that vehicle A has a position of $X_{A1}$, $Y_{A1}$ and $Z_{A1}$ for time step 1 on a graphical display. The appropriate corrections are made to vehicle A at step 416. At step 418, the 3-dimensional graphical representation of a car for vehicle A is displayed at the appropriate position for time step 1 in a graphical display as shown in FIG. 8B. At step 426 of FIG. 4A, it is determined that there are other vehicles and traffic signals to display for this time step so the process continues at step 410.

The data for vehicle B is accessed and a 3-dimensional graphical representation of a truck for vehicle B is accessed and the appropriate position on the 3-dimensional graphical representation for vehicle B is determined. The 3-dimensional graphical representation of a truck for vehicle B is displayed at the appropriate position for time step 1 in the graphical display as shown in FIG. 8B. The process then continues for vehicles C and D. A 3-dimensional representation of a truck is displayed in the appropriate position for time step 1 for vehicle C and a 3-dimensional representation of a car is displayed in the appropriate position for time step 1 for vehicle D.

Also from FIG. 7A, the traffic signal data is accessed and the traffic signal state for traffic signal 1 (802) is determined to be green for time step 1. As such, traffic signal 1 (802) is shown as being green in FIG. 8B. The traffic signal state for traffic signal 2 is accessed and determined to be red for time step 1. As such traffic signal 2 (804) is shown as being red in FIG. 8B.

Figure 8C:
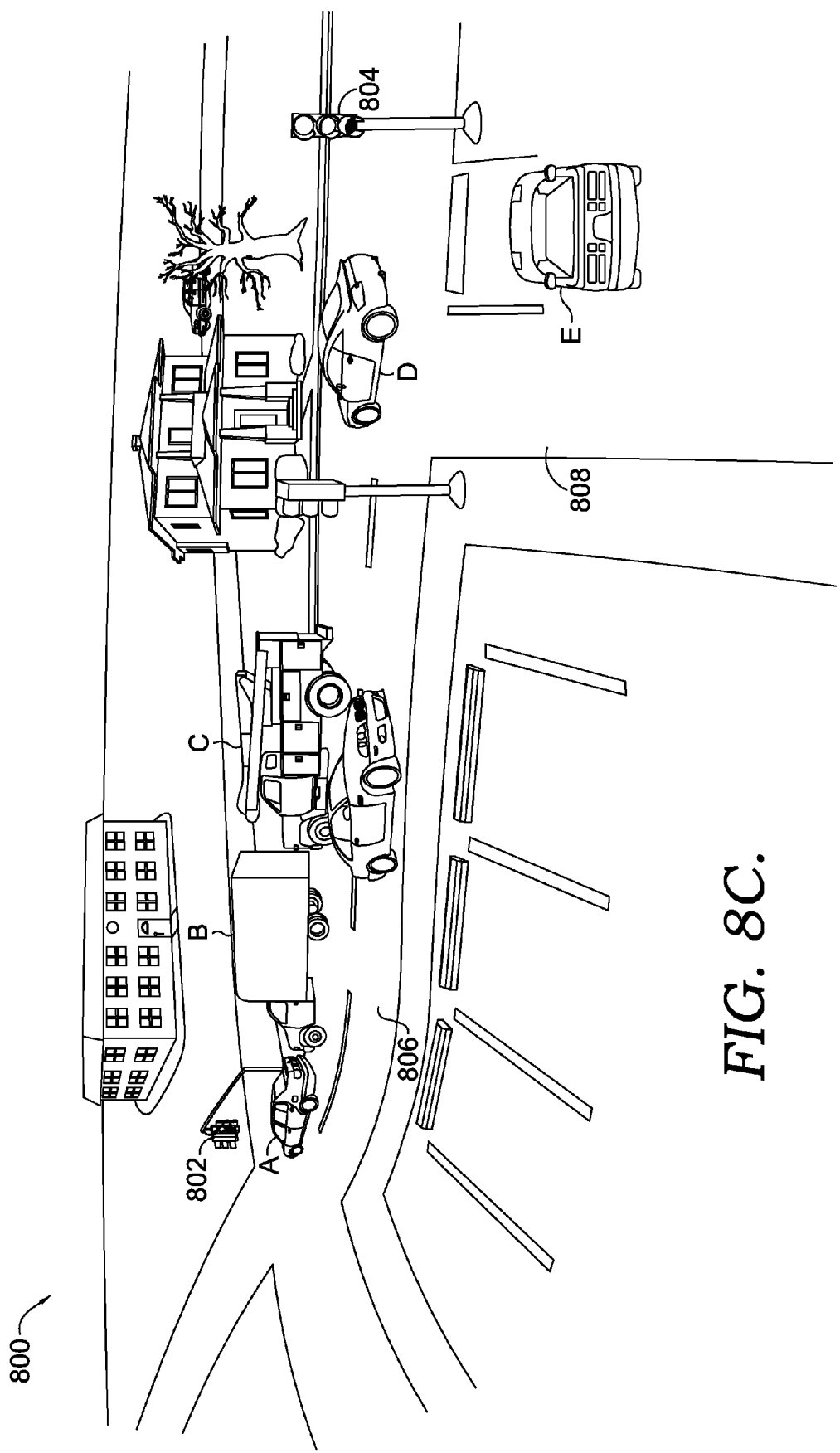

For the next time step of the simulation, data for time step 2 is accessed from FIG. 7B. It will be appreciated that like FIG. 7A, FIG. 7B has been truncated for discussion purposes and shows data only for vehicles A-E. Time step 2 occurs after time step 1. At step 408, data for a time step 2 of the simulation is accessed. At step 410, it is determined whether the data is for a vehicle. At step 411, it is determined that vehicle A has been encountered before, as such at step 414 it is determined that vehicle A has a position of $X_{A2}$, $Y_{A2}$ and $Z_{A2}$ for time step 2 on a 3-dimensional graphical representation. The appropriate corrections are made to vehicle A at step 416. At step 418, the 3-dimensional graphical representation of a car for vehicle A is displayed at the appropriate position for time step 2 in a graphical display as shown in FIG. 8C. At step 426 of FIG. 4A, it is determined that there are other vehicles and traffic signals to display for this time step so the process continues at step 410.

The data for vehicle B is accessed and a 3-dimensional graphical representation of a truck for vehicle B is accessed and the appropriate position on the graphical display for vehicle B for time step 2 is determined. The 3-dimensional graphical representation of a truck for vehicle B is displayed at the appropriate position in the graphical display for time step 2 as shown in FIG. 8C. The process then continues for vehicles C and D. A 3-dimensional representation of a truck is displayed in the appropriate position for time step 2 for vehicle C and a 3-dimensional representation of a car is displayed in the appropriate position for time step 2 for vehicle D in FIG. 8C. Vehicle E is a new vehicle that was not in the graphical display for time step 1 shown in FIG. 8C. A 3-dimensional representation of a car is determined and displayed in the appropriate position for time step 2 for vehicle E in FIG. 8C.

As can be seen from the changing positions of the vehicles from time step 1 (FIG. 8B) and time step 2 (FIG. 8C), the simulated traffic pattern has changed. Vehicles A, B and C have moved forward on roadway 806 from time step 1 to time step 2. Vehicle D has turned from roadway 808 to roadway 806 from time step 1 to time step 2. Vehicle E has newly entered the graphical representation in time step 2.

Also from FIG. 7B, the traffic signal state is accessed and the traffic signal data for traffic signal 1 (802) is determined to be green for time step 2. As such, traffic signal 1 (802) is shown as being green in FIG. 8C. The traffic signal state for traffic signal 2 is accessed and determined to be green for time step 2. As such traffic signal 2 (804) is shown as being green in FIG. 8C. The color of traffic signal 2 (804) has changed from red to green from time step 1 to time step 2.

Figure 8D:
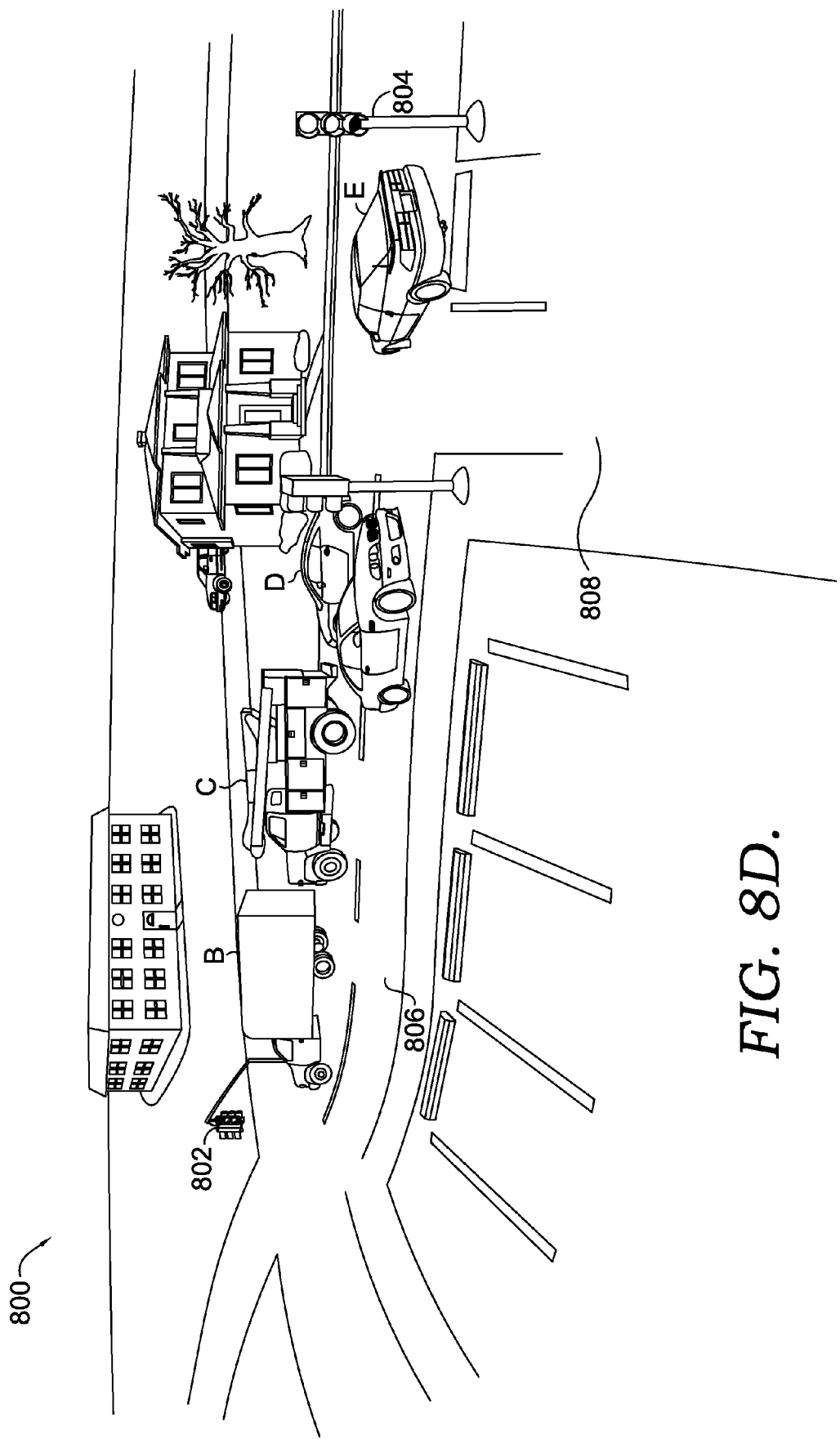

For the next time step of the simulation, data for time step 3 is accessed from FIG. 7C. It will be appreciated that like FIGS. 7A and 7B, FIG. 7C has been truncated for discussion purposes and shows data only for vehicles B-E. Time step 3 occurs after time step 2. At step 408, data for a time step 3 of the simulation is accessed. At step 410, it is determined whether the data is for a vehicle. As vehicle B has been encountered before, at step 414 it is determined that vehicle B has a position of $X_{B3}$, $Y_{B3}$ and $Z_{B3}$ for time step 3 on a graphical display. The appropriate corrections are made to vehicle B at step 416. At step 418, the 3-dimensional graphical representation of a truck for vehicle B is displayed at the appropriate position for time step 3 in a graphical display as shown in FIG. 8D. At step 426 of FIG. 4A, it is determined that there are other vehicles and traffic signals to display for this time step so the process continues at step 410.

The data for vehicle C is accessed and the appropriate position on the graphical display for vehicle C for time step 3 is determined. The 3-dimensional graphical representation of a truck for vehicle C is displayed at the appropriate position in the graphical display for time step 3 as shown in FIG. 8D. The process then continues for vehicles D and E. A 3-dimensional representation of a car is displayed in the appropriate position for time step 3 for vehicle D in FIG. 8D. A 3-dimensional representation of a car is displayed in the appropriate position for time step 3 for vehicle E in FIG. 8D.

As can be seen from the changing positions of the vehicles from time step 2 (FIG. 8C) and time step 3 (FIG. 8D), the simulated traffic pattern has changed. Vehicle A has moved forward out of the graphical representation and is no longer shown in FIG. 8D. Vehicles B, C and D are lined up behind one another in traffic on roadway 806 from time step 2 to time step 3. Vehicle E is stuck in the intersection of roadways 806 and 808 while trying to make a left-hand turn in time step 3.

Also from FIG. 7C, the traffic signal data is accessed and the traffic signal state for traffic signal 1 (802) is determined to be red for time step 3. As such, traffic signal 1 (802) is shown as being red in FIG. 8C. The state of traffic signal 1 (802) has changed from green to red from time step 2 to time step 3. The traffic signal data for traffic signal 2 is accessed and determined to be green for time step 3. As such traffic signal 2 (804) is shown as being green in FIG. 8D. The color of traffic signal 2 (804) has remained the same from time step 2 to time step 3. FIG. 8D. The color of traffic signal 2 (804) has remained the same from time step 2 to time step 3.

By way of another example, and not limitation, with reference to FIG. 4B, an exemplary method for accessing extracted time step data for determining the pathway of a vehicle in a simulation is shown. At step 434, data for a vehicle within a simulation is accessed. For example, with reference to FIG. 7A, data for vehicle A is accessed. It will be appreciated FIG. 7A has been truncated for discussion purposes and shows data only for vehicles A-D. FIG. 7A, if not truncated for discussion purposes, would include vehicle data, such as type and position, for all vehicles shown in FIG. 8B.

At step 436, it is determined whether the vehicle has not been encountered before. Since vehicle A has not been encountered before, at step 438, it is determined that vehicle A is a car and the appropriate 3-dimensional vehicle is obtained. At step 439, 439A and 440 it is determined that vehicle A has a position of $X_{A1}$, $Y_{A1}$ and $Z_{A1}$ for time step 1 on a graphical display. The appropriate corrections are made to vehicle A at step 442. At step 444, the 3-dimensional graphical representation of a car for Vehicle A is displayed at the appropriate position for time step 1 in a graphical display as shown in FIG. 8B. At step 446 of FIG. 4B, it is determined whether the vehicle is in another time step for the simulation. If so, the process continues at step 439 for the vehicle at the next time step. For example, time step data for vehicle A for time step 2 is accessed from FIG. 7B. In this instance, only the position of vehicle A is accessed as the vehicle has been encountered previously in time step 1. This way the path of the individual vehicle is determined throughout the simulation.

The present invention has been described in relation to particular embodiments, which are intended in all respects to illustrate rather than restrict. Alternative embodiments will become apparent to those skilled in the art that do not depart from its scope. Many alternative embodiments exist, but are not included because of the nature of the invention. A skilled programmer may develop means for implementing the aforementioned improvements without departing from the scope of the present invention.

It will be understood that certain features and sub-combinations of utility may be employed without reference to features and sub-combinations and are contemplated within the scope of the claims. Furthermore, the steps performed need not be performed in the order described.

The invention claimed is:

1. One or more computer-storage media having computer-useable instructions embodied thereon for causing a computing device to perform a computer-implemented method for extracting and transferring simulated movement data in real time, the method comprising:

receiving from a simulation simulated movement data for multiple time steps that include an indication of a certain location of a vehicle, wherein each of the multiple time steps is a different point in time in the simulation;

by way of a processor of said computing device, extracting from the simulated movement data simulated movement time step data that include a vehicle identifier, a vehicle-type indicator, and a vehicle location;

determining whether a first time step of the multiple time steps is within a designated recording period, wherein the designated recording period is a recording period that starts after the simulation begins;

if the first time step is within the designated recording period, assigning simulated movement time step data for the first time step to an at least one step scanner that transfers simulated movement time step data for a first vehicle of the first time step to a worker thread;

if the first time step is not within the designated recording period, terminating the at least one step scanner and the worker thread;

upon determining that the first time step is within the designated recording period, extracting from the simulated movement time step data for the first time step a vehicle identifier, a vehicle-type indicator, and a vehicle location that describes a location of the first vehicle within the first time step such that the vehicle identifier, the vehicle-type indicator, and the vehicle location are accessible to a virtual reality interface for creating a three-dimensional environment in a virtual reality application;

transferring extracted vehicle data for the first time step from the worker thread to the virtual reality interface via one of a plurality of pipes, wherein each pipe carries extracted vehicle data that was extracted from a different time step by a different worker thread, wherein transferring includes, (a) determining whether any of the pipes is not currently being utilized, (b) when it is determined that a pipe is not being used to transfer extracted vehicle data, utilizing the pipe to transfer the extracted vehicle data for the first time step to the virtual reality interface;

accessing the virtual reality application by the virtual reality interface for associating with the first vehicle an appropriate three-dimensional representation based on the first vehicle identifier and the first vehicle-type indicator;

determining appropriate corrections for displaying the three-dimensional representation of the first vehicle, wherein the appropriate corrections include adjustments to heading, pitch, and roll of the three-dimensional representation for the first time step so that the first vehicle has a correct orientation in the three-dimensional environment of the virtual reality application; and according to the first vehicle location of the first vehicle, displaying the corrected three-dimensional representation of the first vehicle for the first time step.

2. The media of claim 1, wherein the method further comprises:

extracting simulated movement data for a second time step from the simulated movement time step data, wherein the simulated movement time step data for the second time step include a vehicle identifier, a vehicle-type indicator, and a vehicle location that describes a location of the first vehicle within the second time step; and transferring extracted data for the second time step.

3. One or more computer-storage media having computer-executable instructions embodied thereon for performing a computer-implemented method for presenting on a display device a simulation of traffic that is made up of real-world vehicles ("vehicles") in real-time, the method comprising:

receiving from a simulation simulated movement data for multiple time steps that include an indication of a certain location of a first vehicle and a second vehicle, wherein each of the multiple time steps is a different point in time in the simulation;

assigning the simulated movement data to a plurality of step scanners, wherein each of the step scanners is assigned simulated movement data for a different time step, and wherein multiple time steps are processed in parallel by the step scanners;

at each step scanner,
  (a) parsing the movement data for the time step assigned to the step scanner to determine whether the movement data include vehicle data,
  (b) when the movement data include vehicle data, associating the vehicles into groups of vehicles, and
  (c) assigning the groups of vehicles to a plurality of threads within the step scanner, wherein each thread is assigned a different group of vehicles, wherein each thread extracts vehicle data from the simulated movement data for each vehicle in the group of vehicles assigned to the thread, wherein the threads within the step scanner process the simulated movement data for the time step in parallel;

extracting from the simulated movement data for a first time step simulated movement time step data that include a first vehicle identifier, a first vehicle-type indicator, and a first vehicle location that describes a first location of the first vehicle such that the first vehicle identifier, the first vehicle-type indicator, and the first vehicle location are accessible to a virtual reality interface for creating a three-dimensional environment in a virtual reality application;

inspecting the simulated movement time step data to determine whether the first vehicle has been previously encountered;

if the first vehicle has been previously encountered, updating an existing vehicle history which stores vehicle-identification information, vehicle-type information, and vehicle-location information, wherein said updating includes updating the vehicle-location information to reflect the first vehicle location;

if the first vehicle has not been previously encountered, storing in the vehicle history the first vehicle identifier, the first vehicle-type indicator, and the first vehicle location;

determining whether the first time step is within a designated recording period in the simulation, wherein a designated recording period is a recording period included in a simulation that starts after the simulation begins;

if the first time step is within the designated recording period, assigning simulated movement time step data for the first time step to a first step scanner of the plurality of step scanners that transfers simulated movement time step data for the first vehicle of the first time step to a first worker thread of the plurality of threads within the first step scanner;

if the first time step is not within the designated recording period, terminating the first step scanner and the first worker thread;

transferring the extracted data via at least one connection to the virtual reality application for associating with the first vehicle an appropriate three-dimensional representation based on the first vehicle identifier and the first vehicle-type indicator;

repeating said extracting, inspecting, and associating steps for the second vehicle to derive a three-dimensional representation that corresponds to the second vehicle; and according to the first vehicle location that describes the first location of the first vehicle and a second vehicle location that describes a location of the second vehicle, displaying on the display device the three-dimensional representation of the first vehicle and the three-dimensional representation of the second vehicle.

4. The media of claim 3, wherein the method further comprises:

determining appropriate corrections for displaying the three-dimensional representations of the first vehicle and the second vehicle, wherein the appropriate corrections include adjustments to one or more of heading, pitch, and roll of the three-dimensional representations.

5. The media of claim 3, wherein the simulated movement data include a state of a traffic signal.

6. The media of claim 3 further comprising, wherein the three-dimensional representation for both the first vehicle and the second vehicle is obtained from the virtual reality application.

* * * * *